(12) United States Patent
Kim et al.

(10) Patent No.: US 11,726,120 B2
(45) Date of Patent: Aug. 15, 2023

(54) INSULATION RESISTANCE INSPECTION SYSTEM FOR BATTERY MODULE CELL POUCH

(71) Applicants: HYUNDAI MOTOR COMPANY, Seoul (KR); KIA CORPORATION, Seoul (KR)

(72) Inventors: Kyungmo Kim, Hwaseong-si (KR); Hyunjun Yoon, Goyang-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 0 days.

(21) Appl. No.: 17/544,907

(22) Filed: Dec. 7, 2021

(65) Prior Publication Data
US 2022/0365122 A1 Nov. 17, 2022

(30) Foreign Application Priority Data
May 11, 2021 (KR) .................. 10-2021-0060880

(51) Int. Cl.
*G01R 27/02* (2006.01)
*G01R 31/385* (2019.01)
*G01R 31/12* (2020.01)
*H01M 50/105* (2021.01)
*H01M 50/569* (2021.01)

(52) U.S. Cl.
CPC ....... *G01R 27/025* (2013.01); *G01R 31/1263* (2013.01); *G01R 31/385* (2019.01); *H01M 50/105* (2021.01); *H01M 50/569* (2021.01)

(58) Field of Classification Search
CPC .. G01R 27/025; G01R 31/1263; G01R 1/073; G01R 31/3865; G01R 31/396; G01R 31/389; G01R 31/364; H01M 50/105; H01M 50/569; Y02E 60/10
See application file for complete search history.

(56) References Cited

U.S. PATENT DOCUMENTS

| | | | |
|---|---|---|---|
| 8,742,764 B2* | 6/2014 | Lee | G01R 31/1263 324/437 |
| 10,969,438 B2* | 4/2021 | Han | H01M 10/4285 |
| 2014/0091805 A1* | 4/2014 | Moriguchi | H01M 50/224 324/426 |
| 2020/0176745 A1* | 6/2020 | Lee | H01M 50/242 |
| 2021/0302507 A1* | 9/2021 | O'Mahony | B60L 58/16 |

* cited by examiner

*Primary Examiner* — Jermele M Hollington
*Assistant Examiner* — Zannatul Ferdous
(74) *Attorney, Agent, or Firm* — McDonnell Boehnen Hulbert & Berghoff LLP

(57) ABSTRACT

An insulation resistance inspection system for a battery module cell pouch for inspecting an insulation resistance state of a cell pouch in the battery module configured by assembling a plurality of battery cells includes: an inspection unit bringing each of a plurality of probe modules into contact with an end surface of the cell pouch to measure an insulation resistance of the cell pouch; an interface unit connected to the inspection unit to receive a signal for the measured insulation resistance of the cell pouch; and a control unit receiving the signal for the insulation resistance of the cell pouch through the interface unit to determine whether the cell pouch is in good condition or in poor condition depending on whether the signal for the insulation resistance of the cell pouch is within a normal range that is a reference of good quality.

7 Claims, 10 Drawing Sheets

INSULATION RESISTANCE INSPECTION SYSTEM FOR BATTERY MODULE CELL POUCH

CROSS-REFERENCE TO RELATED APPLICATION

This application claims priority to and the benefit of Korean Patent Application No. 10-2021-0060880 filed in the Korean Intellectual Property Office on May 11, 2021, the entire contents of which are incorporated herein by reference.

BACKGROUND

(a) Field

The present disclosure relates to an insulation resistance inspection system for a battery module cell pouch. More particularly, the present disclosure relates to an insulation resistance inspection system for a battery module cell pouch capable of inspecting an insulation resistance of a battery module using an inspection probe assembly to which probe guides having a wedge shape are applied.

(b) Description of the Related Art in general, a battery pack for an eco-friendly vehicle is manufactured by assembling a plurality of battery modules, each being configured by assembling a plurality of battery cells (cell pouches), such that the battery pack is finally mounted on the vehicle. Such a battery module is configured as a module having a required capacity by stacking and bonding a predetermined number of cell pouches for assembling. In this case, a bonding process is performed for fixation between the cell pouches.

There is a possibility that the insulation performance of the cell pouch may be destroyed by foreign metallic substances or other burrs of jigs in the module process. For this reason, most battery manufacturers conduct insulation resistance inspection with respect to modules as finished products before being assembled into battery packs.

In order to inspect individual cell pouches for insulation in a module unit, it is required that end surfaces of the cell pouches be exposed even when the cell pouches are assembled into a module in a finished product state, and it is also required that spaces be secured for insulation resistance inspection probes to enter and contact the end surfaces of the individual cell pouches. If not so, the insulation resistance inspection of the individual cell pouches may be replaced with inspection representing an insulation resistance of the module using a metal enclosure of the module, but it should be noted that the inspection of the insulation resistance using enclosure of the module has a problem in that a case where a cell pouch inside the module is damaged and the insulation of the cell pouch is broken, the defective insulation does not appear.

The above information disclosed in this Background section is only for enhancement of understanding of the background of the disclosure, and therefore it may contain information that does not form the prior art that is already known in this country to a person of ordinary skill in the art.

SUMMARY

The present disclosure has been made in an effort to provide a highly reliable insulation resistance inspection system capable of detecting an insulation defect of a cell pouch inside a battery module to detect all insulation defects that may occur in the entire battery module.

An exemplary embodiment of the present disclosure provides an insulation resistance inspection system for a battery module cell pouch for inspecting an insulation resistance state of the cell pouch in a battery module configured by assembling a plurality of battery cells, the insulation resistance inspection system including an inspection unit bringing each of a plurality of probe modules into contact with an end surface of the cell pouch to measure an insulation resistance of the cell pouch, an interface unit connected to the inspection unit to receive a signal for the measured insulation resistance of the cell pouch, and a control unit receiving the signal for the insulation resistance of the cell pouch through the interface unit to determine whether the cell pouch is in good condition or in poor condition depending on whether the signal for the insulation resistance of the cell pouch is within a normal range that is a reference of good quality.

The inspection unit may include an inspection table below which the battery module is disposed such that the insulation resistance is measured, a tray movably installed on the inspection table, and an inspection probe assembly installed on the tray to contact the end surface of the cell pouch such that the insulation resistance is measured.

The insulation resistance inspection system may further include a driving cylinder disposed on the inspection table and connected to the tray to drive the tray forward or backward in a length direction of the inspection table.

The inspection table may be attached to a vertical driving unit to be movable in a vertical direction.

The tray may be provided to move along a rail attached to a lower side of the inspection table.

The inspection probe assembly may include a slot die installed on the tray, and the plurality of probe modules fixedly installed side by side in the slot die and disposed to individually contact a plurality of cell pouches at respective positions corresponding to the plurality of cell pouches.

Each of the probe modules may include a cell pouch entry portion entering the cell pouch in contact with an exposed portion of the end surface of the cell pouch, an electrical conduction portion provided inside the cell pouch entry portion and brought into contact with the cell pouch for electrical conduction, a support fixed to a rear end of the cell pouch entry portion in a length direction of the cell pouch entry portion, a pressure spring provided on an outer circumferential surface of the support and supported by the end of the cell pouch entry portion to provide a pressing force to the cell pouch entry portion, and a signal line electrically connected to the electrical conduction portion to transmit an electrical signal from the electrical conduction portion to the interface unit.

The insulation resistance may be measured using the electrical signal measured by the probe module and an electrical signal measured through a leeno pin contacting a negative electrode lead of the battery cell.

The cell pouch entry portion may include entry guides facing each other in a wedge shape, and the cell pouch may be inserted through the entry guides to contact the electrical conduction portion.

The electrical conduction portion may be formed of electrically conductive rubber or copper (Cu).

According to the present disclosure, it is possible to detect an insulation defect of a cell pouch inside the battery module to detect all insulation defects that may occur in the entire battery module, resulting in high inspection reliability.

In addition, according to the present disclosure, by applying the probe guides in the wedge shape, it is easy for the inspection probe to enter a narrow space between the cell pouches.

In addition, according to the present disclosure, it is possible to improve a contact force between the exposed portion of the flexible cell pouch and the electrical conduction portion of the inspection probe, thereby easily inspecting an insulation resistance of the cell pouch in the module as a finished product unit or before assembling a housing cover.

In addition, by providing the simple inspection equipment, it is possible to secure highly reliable inspection accuracy at a low investment cost, thereby reducing the cost in producing a battery pack for an eco-friendly vehicle.

DETAILED DESCRIPTION

Figure 1:
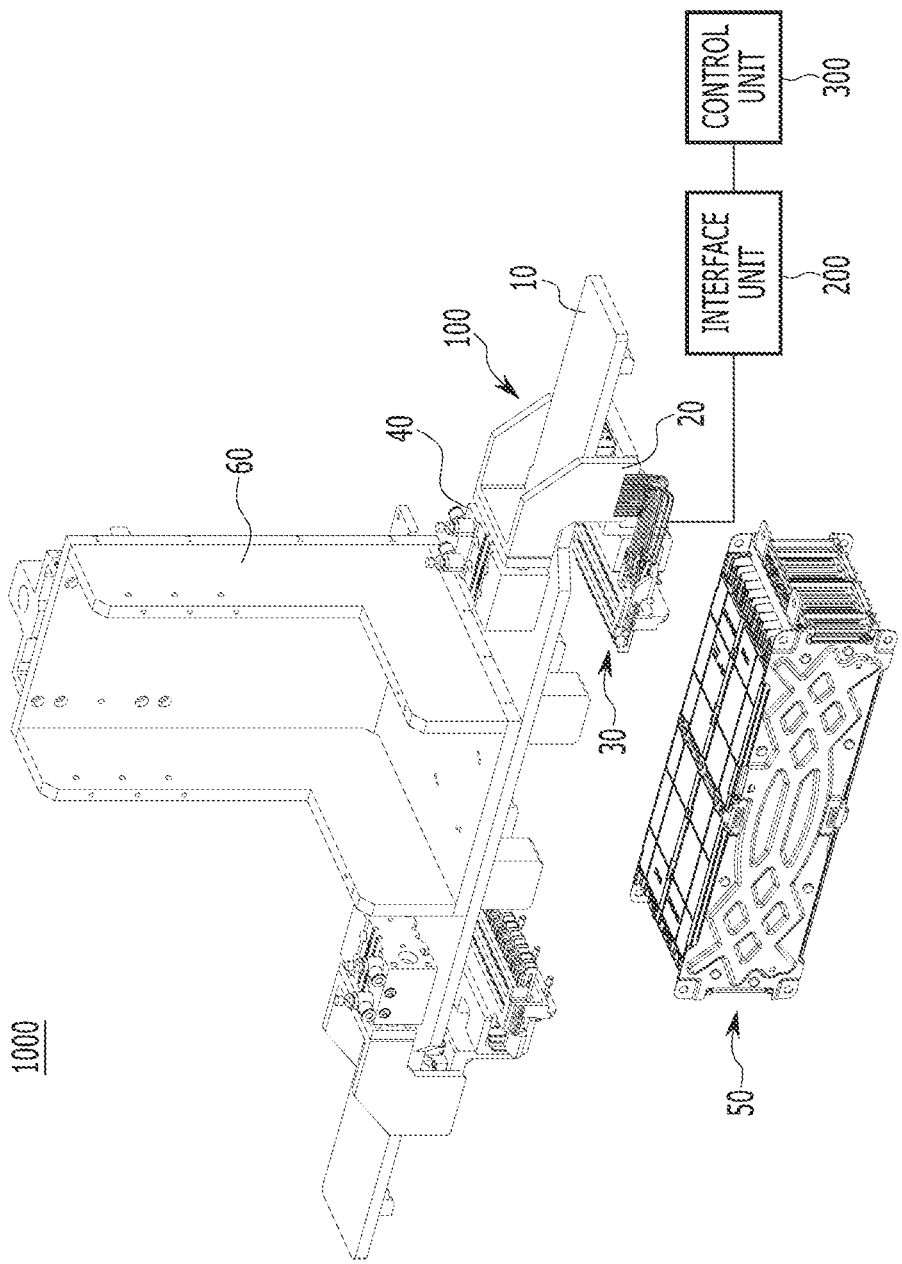
FIG. 1 is a diagram showing a standby state before inspection of an insulation resistance inspection system for a battery module cell pouch according to an exemplary embodiment of the present disclosure.

Hereinafter, exemplary embodiments of the present disclosure will be described in detail with reference to the accompanying drawings so that they can be easily carried out by those of ordinary skill in the art to which the present disclosure pertains. The present disclosure may be implemented in various different forms and is not limited to the exemplary embodiments described herein.

In addition, in describing various exemplary embodiments, the same configuration will be representatively described in one exemplary embodiment using like reference numerals for like components, and only configurations different from those in the one exemplary embodiment will be described in the other exemplary embodiments.

It shall be noted that the drawings are schematic and do not depict exact dimensions. The relative proportions and ratios of elements in the drawings may be exaggerated or diminished in size for the sake of clarity and convenience in the drawings, and such arbitrary proportions are only illustrative and not limiting in any way. Like reference numerals are used for like structures, elements, or parts shown in two or more drawings to show similar characteristics. When one part is referred to as being "over" or "on" another part, the one part may be directly over or on the other part or there may be an intervening part therebetween.

The exemplary embodiment of the present disclosure shows an exemplary embodiment of the present disclosure in detail. As a result, various modifications of the drawings are expected. Therefore, the exemplary embodiment is not limited to a specific aspect of the illustrated region, and for example, includes modifications of an aspect by manufacturing.

Hereinafter, an insulation resistance inspection system for a battery module cell pouch according to an exemplary embodiment of the present disclosure will be described with reference to FIGS. 1 and 2.

Figure 2:
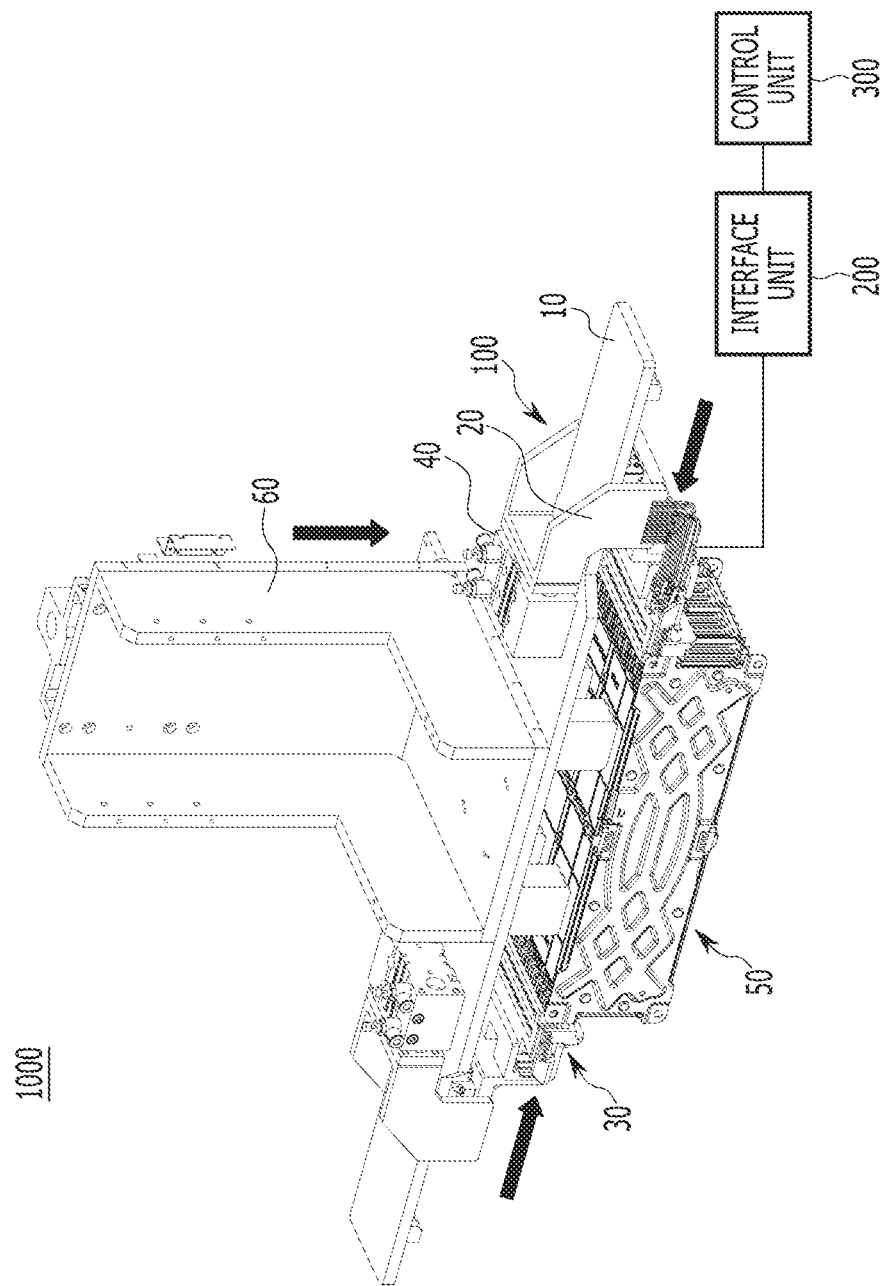
FIG. 2 is a diagram showing a battery cell-mounted state for inspection of an insulation resistance inspection system for a battery module cell pouch according to an exemplary embodiment of the present disclosure.

FIG. 1 is a diagram showing a standby state before inspection of an insulation resistance inspection system for a battery module cell pouch according to an exemplary embodiment of the present disclosure, and FIG. 2 is a diagram showing a battery cell-mounted state for inspection of an insulation resistance inspection system for a battery module cell pouch according to an exemplary embodiment of the present disclosure.

Referring to FIGS. 1 and 2, an insulation resistance inspection system 1000 for a battery module cell pouch according to an exemplary embodiment of the present disclosure is for inspecting an insulation resistance state of a cell pouch 52 in a battery module 50 configured by assembling a plurality of battery cells, and includes an inspection unit 100, an interface unit 200, and a control unit 300.

The battery module 50 includes a cell stack including a plurality of battery cells stacked, and a sensing block on which a bus bar electrically connected to respective leads of the plurality of battery cells to sense voltage information is mounted. The battery cell includes a negative electrode plate, a positive electrode plate, and a separator interposed between the negative electrode plate and the positive electrode plate. A negative electrode lead is provided on the negative electrode plate, and a positive electrode lead is provided on the positive electrode plate. Such a battery cell has a structure in which the negative electrode plate, the separator, and the positive electrode plate are sequentially stacked and surrounded by the cell pouch 52. In this structure, the negative electrode lead and the positive electrode lead are exposed to the outside of the cell pouch 52. In addition, fixing plates are disposed on both side surfaces of the cell stack, in which the plurality of battery cells overlap one another, in a width direction.

The inspection unit 100 brings each of a plurality of probe modules 34 into contact with an end surface of the cell pouch 52 to measure an insulation resistance of the cell pouch 52.

In addition, the interface unit 200 is connected to the inspection unit 100 to receive a signal for the measured insulation resistance of the cell pouch 52, and the control unit 300 is connected to the interface unit 200 to receive the signal for the insulation resistance of the cell pouch 52 through the interface unit 200 and determine whether the cell pouch 52 is in good condition or in poor condition. The condition of the cell pouch 52 is determined based on whether the signal for the insulation resistance of the cell pouch 52 is within a normal range that is a reference of good quality. For example, the signal for the insulation resistance as a reference of good quality of the cell pouch 52 may be set to about 100 MO.

In order to inspect an insulation resistance of the battery module 50, the battery module 50 is disposed below the insulation resistance inspection system 1000. The inspection unit 100 includes an inspection table 10, trays 20, and inspection probe assemblies 30.

The inspection table 10 may be attached to a vertical driving unit 60, and the inspection table 10 may move in a vertical direction as the vertical driving unit 60 moves in the vertical direction. The vertical driving unit 60 may move along a rail (not shown), and an approximately central portion of the inspection table 10 may be attached to a lower surface of the vertical driving unit 60.

The trays 20 movably installed on the inspection table 10, and the inspection probe assemblies 30 installed on the trays 20 to contact the end surfaces of the cell pouches 52 and measure insulation resistances of the cell pouches 52 are disposed on both sides of the inspection table 10 in a length direction, respectively.

In addition, driving cylinders 40 connected to the trays 20 to drive the trays 20 forward or backward in the length direction of the inspection table 10 may be provided on both sides of the inspection table 10 in the length direction, respectively.

As shown in FIG. 2, for the insulation resistance inspection of the battery module 50, the vertical driving unit 60 moves downward in a state where the battery module 50 is disposed below the insulation resistance inspection system 1000, and accordingly, the inspection table 10 moves toward an upper surface of the battery module 50. Thereafter, the driving cylinders 40 may be driven to move the trays 20 along a rail 15 toward side surfaces of the battery module 50 on both sides of the battery module 50. Then, the inspection probe assemblies 30 installed on the trays 20 contact the end surfaces of the cell pouches 52 in the battery module 50 to measure an insulation resistance of the battery module 50.

Figure 3:
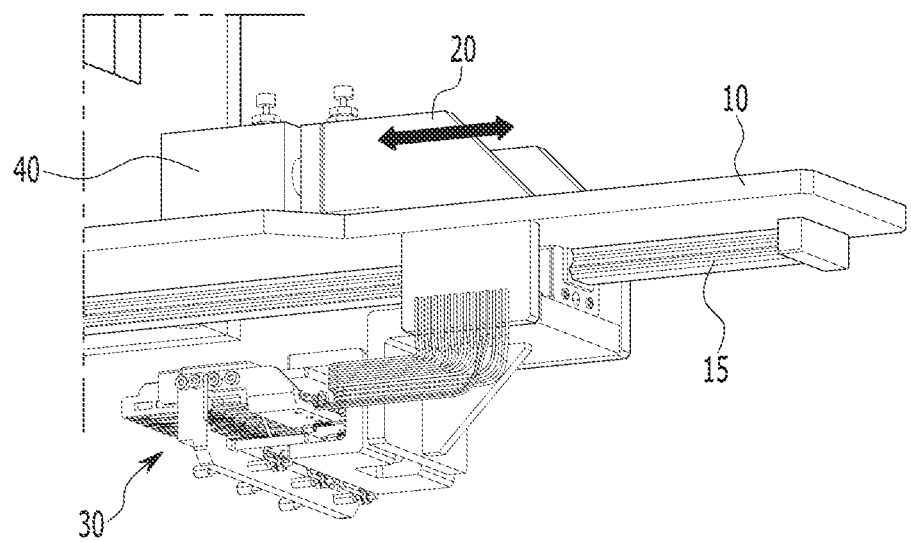
FIG. 3 is a diagram showing an inspection unit in an insulation resistance inspection system for a battery module cell pouch according to an exemplary embodiment of the present disclosure.

FIG. 3 is a diagram showing an inspection unit in an insulation resistance inspection system for a battery module cell pouch according to an exemplary embodiment of the present disclosure.

Referring to FIG. 3, the rail 15 is installed on a lower surface of the inspection table 10, and the trays 20 may be moved forward and backward along the rail 15 in the length direction of the inspection table 10 by the driving cylinders 40 fixedly disposed on the inspection table 10.

The inspection probe assemblies 30 may be attached to the trays 20 in a direction to face the central portion of the inspection table 10 below the inspection table 10, and may move forward or backward with respect to both side surfaces of the battery module 50 disposed below the inspection table 10 as the trays 20 move forward or backward.

Figure 4:
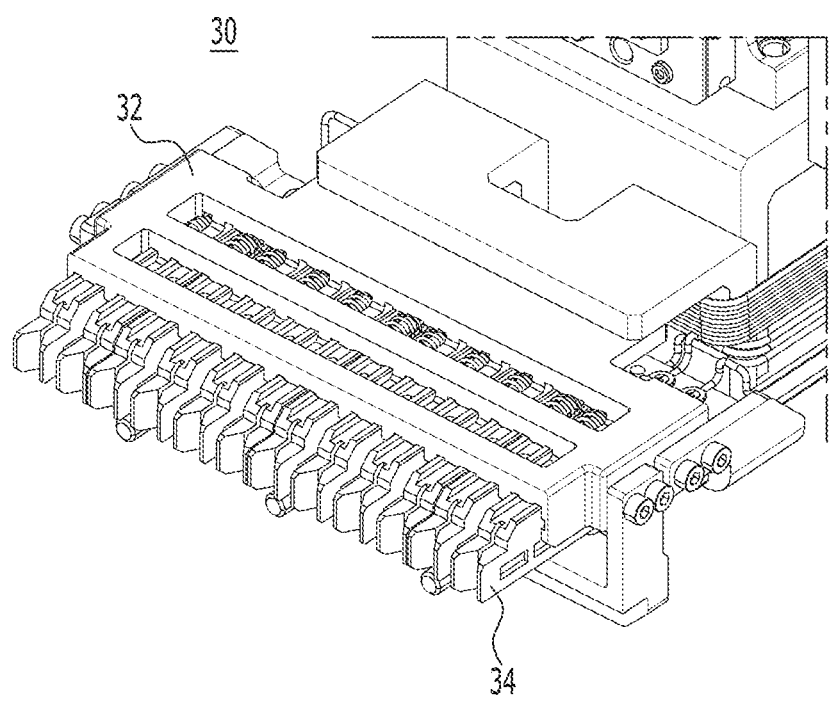
FIG. 4 is a diagram showing an inspection probe assembly of an inspection unit in an insulation resistance inspection system for a battery module cell pouch according to an exemplary embodiment of the present disclosure.

FIG. 4 is a diagram showing an inspection probe assembly of an inspection unit in an insulation resistance inspection system for a battery module cell pouch according to an exemplary embodiment of the present disclosure.

Referring to FIG. 4, the inspection probe assembly 30 includes a slot die 32 installed on the tray 20 in a direction to face the central portion of the inspection table 10, and a plurality of probe modules 34 mounted side by side inside the slot die 32. The plurality of probe modules 34 may be provided in the same number as the plurality of cell pouches 52 of the battery module 50 to be inspected at respective positions corresponding to the plurality of cell pouches 52. Accordingly, respective insulation resistances of the plurality of cell pouches 52 may be measured by the plurality of probe modules 34.

Figure 5:
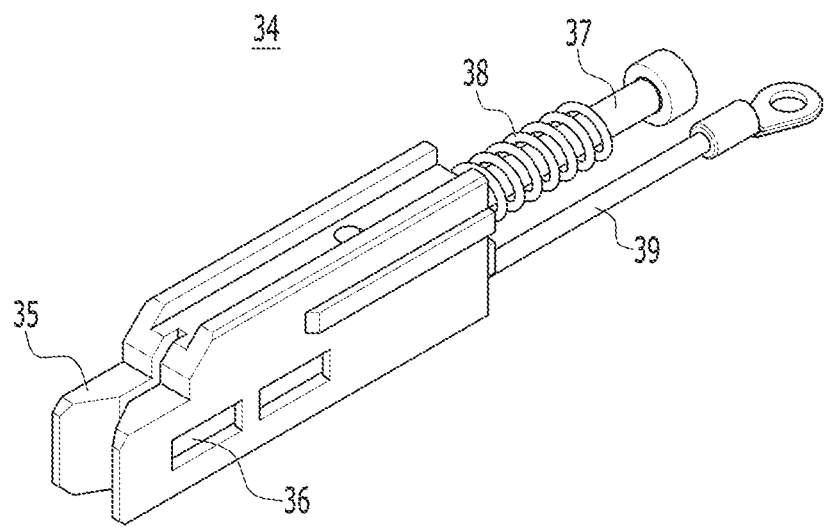
FIG. 5 is a diagram showing a probe module of an inspection probe assembly in an insulation resistance inspection system for a battery module cell pouch according to an exemplary embodiment of the present disclosure.

FIG. 5 is a diagram showing a probe module of an inspection probe assembly in an insulation resistance inspection system for a battery module cell pouch according to an exemplary embodiment of the present disclosure.

Referring to FIG. 5, the probe module 34 includes a cell pouch entry portion 35, an electrical conduction portion 36, a support 37, a pressure spring 38, and a signal line 39.

The cell pouch entry portion 35 is a portion entering the cell pouch 52 in contact with an exposed aluminum portion of the end surface of the cell pouch 52, and includes entry guides facing each other in a wedge shape such that the cell pouch 52 may be inserted between the entry guides.

The electrical conduction portion 36 is provided inside the cell pouch entry portion 35, and is brought into contact with the exposed aluminum portion of the end surface of the cell pouch 52 for electrical conduction while the cell pouch 52 is inserted between the entry guides. The electrical conduction portion 36 may be formed of electrically conductive rubber or copper (Cu).

The support 37 may be fixed to a rear end of the cell pouch entry portion 35 in a length direction of the cell pouch entry portion 35, and the pressure spring 38 supported by the end of the cell pouch entry portion 35 to provide a pressing force to the cell pouch entry portion 35 may be provided on an outer circumferential surface of the support 37. An end of the support 37 is supported by an inner surface of the slot die 32, and the pressure spring 38 may provide a pressing force such that the exposed portion of the end surface of the cell pouch 52 contacts the electrical conduction portion 36 at an appropriate pressure when the tray 20 moves to the side surface of the battery module 50 and the probe module 34 contacts the exposed portion of the end surface of the cell pouch 52.

The signal line 39 is electrically connected to the electrical conduction portion 36, and an electrical signal for an insulation resistance may be transmitted from the electrical conduction portion 36 to the interface unit 200 through the signal line 39.

Figure 6:
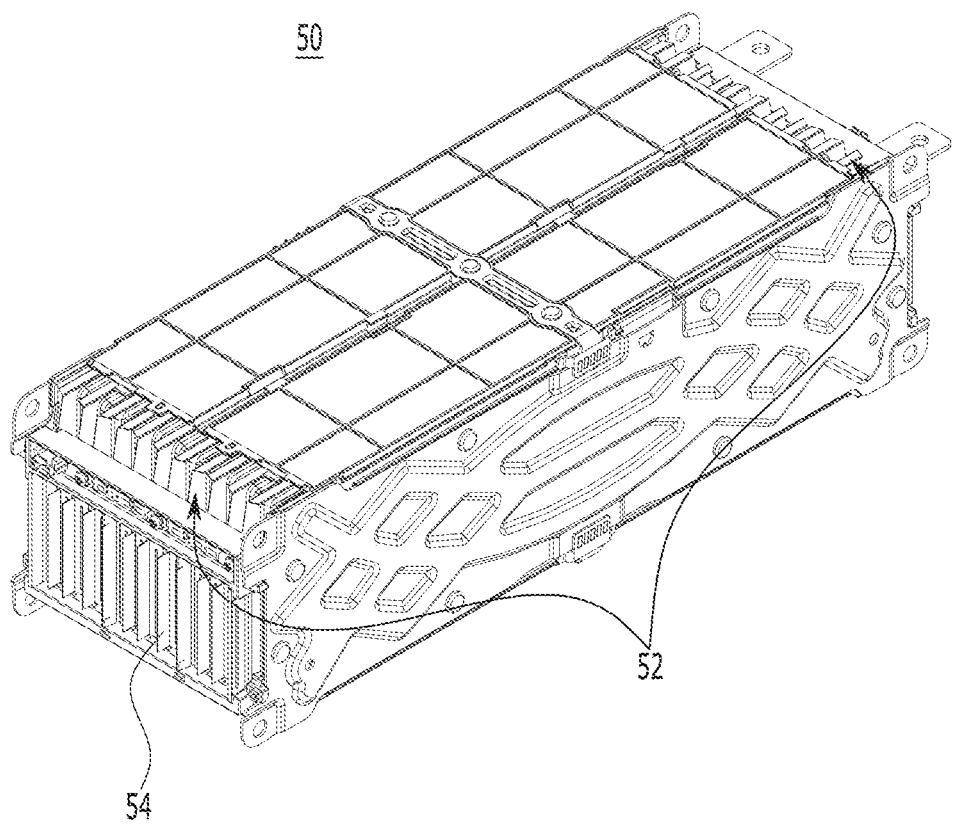
FIG. 6 is a diagram showing a battery module to be inspected in an insulation resistance inspection system for a battery module cell pouch according to an exemplary embodiment of the present disclosure.
Figure 7:
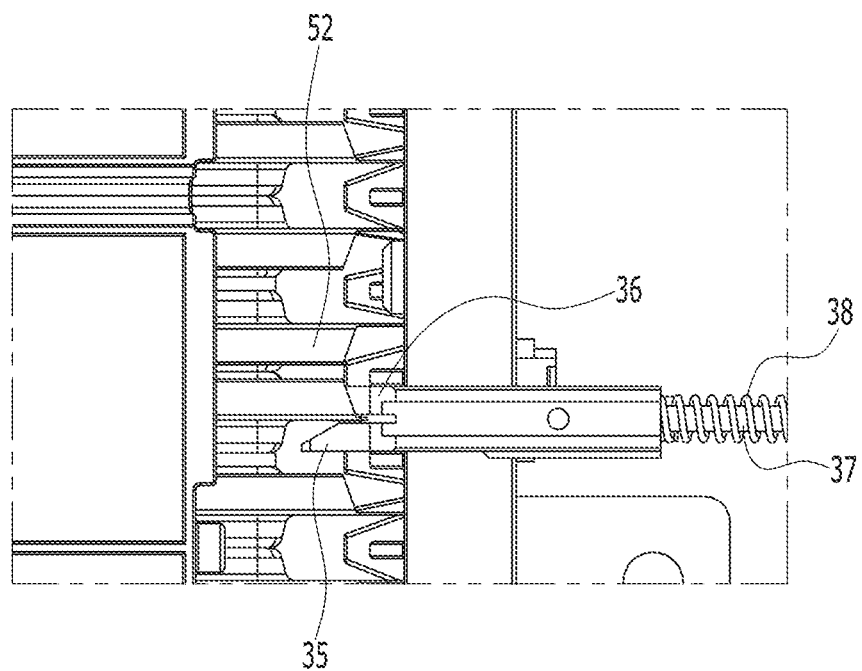
FIG. 7 is a diagram showing a state in which a probe module contacts an exposed portion of a cell pouch in an insulation resistance inspection system for a battery module cell pouch according to an exemplary embodiment of the present disclosure.
Figure 8:
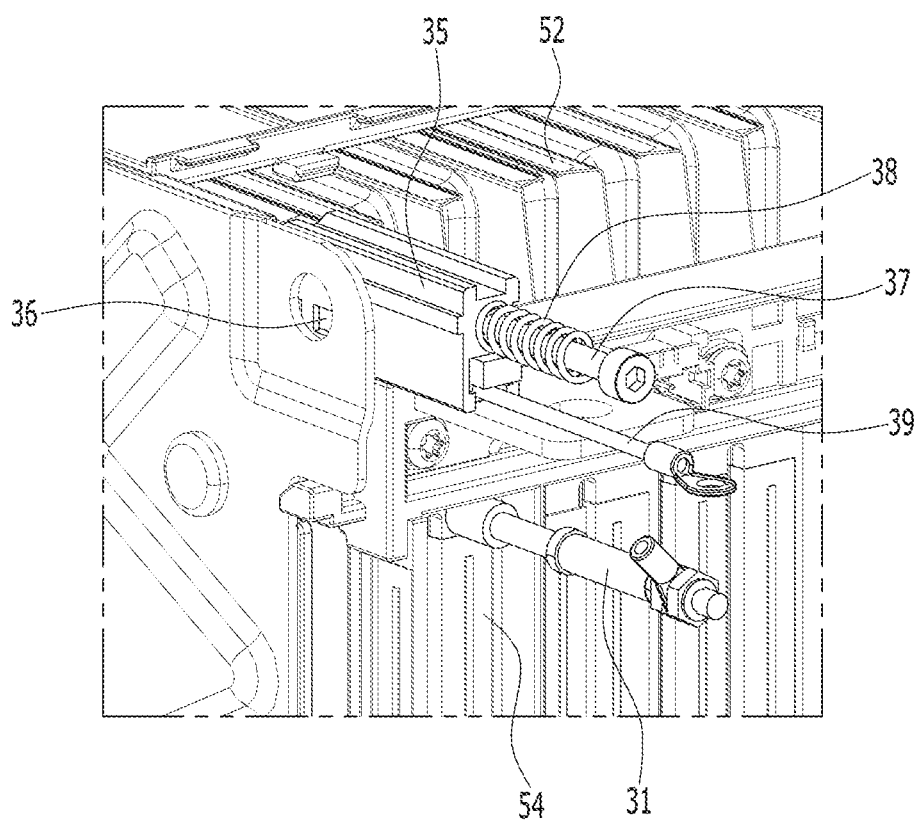
FIG. 8 is a diagram showing a state in which a probe module contacts an exposed portion of a cell pouch and a leeno pin contacts a negative electrode lead of the cell pouch in an insulation resistance inspection system for a battery module cell pouch according to an exemplary embodiment of the present disclosure.

FIG. 6 is a diagram showing a battery module to be inspected in an insulation resistance inspection system for a battery module cell pouch according to an exemplary embodiment of the present disclosure, FIG. 7 is a diagram showing a state in which a probe module contacts an exposed portion of a cell pouch in an insulation resistance inspection system for a battery module cell pouch according to an exemplary embodiment of the present disclosure, and FIG. 8 is a diagram showing a state in which a probe module contacts an exposed portion of a cell pouch and a leeno pin contacts a negative electrode lead of the cell pouch in an insulation resistance inspection system for a battery module cell pouch according to an exemplary embodiment of the present disclosure.

Referring to FIGS. 6 to 8, the exposed portion of the cell pouch 52 is positioned at an upper side portion of the battery module 50, and a negative electrode lead 54 of the battery cell is exposed through a central side portion of the battery module 50. Each of the probe modules 34 of the inspection probe assembly 30 contacts each of the exposed portions of the cell pouches 52.

As shown in FIG. 7, the exposed portion of the cell pouch 52 enters the probe module 34 through the wedge-shaped cell pouch entry portion 35 of the probe module 34, and the exposed portion of the cell pouch 52 entering the probe module 34 contacts the electrical conduction portion 36 provided inside the cell pouch entry portion 35.

In addition, as shown in FIG. 8, a leeno pin 31 is mounted on a lower side of the slot die 32, and the leeno pin 31 contacts the negative electrode lead 54 of the battery cell while the probe module 34 contacts the exposed portion of the cell pouch 52. The leeno pin 31 may be in electrical conduction with the negative electrode lead 54 of the battery cell to transmit an electrical signal from the negative electrode lead 54, An insulation resistance may be measured using the electrical signal measured and transmitted by the probe module 34 and the electrical signal measured and transmitted through the leeno pin 31 contacting the negative electrode lead 54 of the battery cell.

Figure 9:
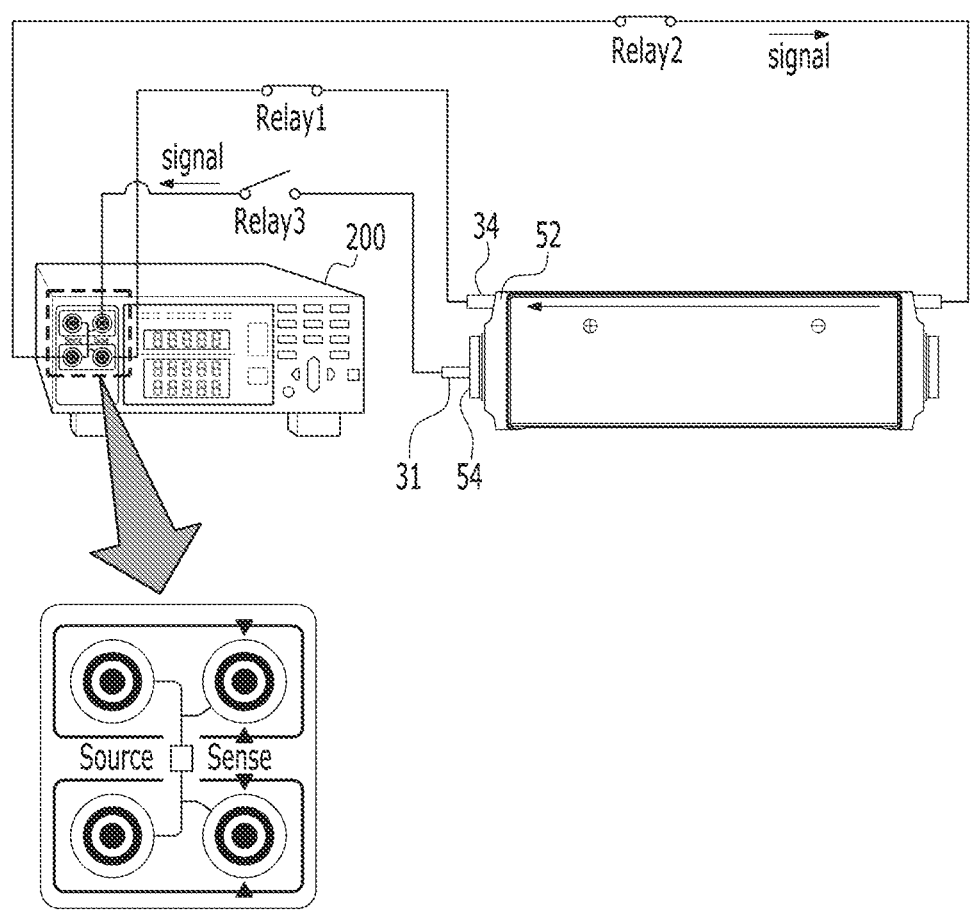
FIG. 9 is a diagram showing a connection relationship for electrical conduction inspection in an insulation resistance inspection system for a battery module cell pouch according to an exemplary embodiment of the present disclosure.
Figure 10:
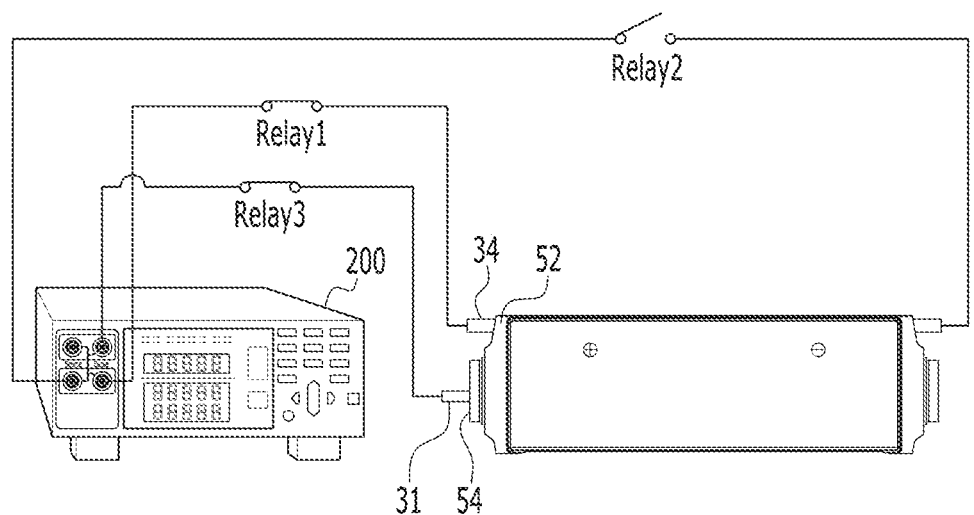
FIG. 10 is a diagram showing a connection relationship for insulation resistance inspection in an insulation resistance inspection system for a battery module cell pouch according to an exemplary embodiment of the present disclosure.

FIG. 9 is a diagram showing a connection relationship for electrical conduction inspection in an insulation resistance inspection system for a battery module cell pouch according to an exemplary embodiment of the present disclosure, and FIG. 10 is a diagram showing a connection relationship for insulation resistance inspection in an insulation resistance inspection system for a battery module cell pouch according to an exemplary embodiment of the present disclosure.

Referring to FIG. 9, the probe modules 34 are connected to the exposed portions at both ends of the cell pouch 52, respectively, to check whether the electrical conduction portions 36 of the probe modules 34 and the exposed portions of the end surfaces of the cell pouch 52 are in normal contact, and the respective probe modules 34 are connected to voltage measurement terminals (Sense and Source) of the interface unit 200 through the signal lines 39. Additionally, the probe module 34 on one side is connected to a sense terminal (Relay1), and the probe module 34 on the opposite side is connected to a source terminal (Relay2).

In this case, when a signal transmitted from the source terminal is received by the sense terminal through an aluminum layer of the cell pouch 52, it may be determined that the electrical conduction portions 36 of the probe modules 34 and the exposed portions of the end surfaces of the cell pouch 52 are in a normal contact state. On the other hand, when a signal transmitted from the source terminal is not received by the sense terminal through the aluminum layer of the cell pouch 52, it may be determined that the electrical conduction portions 36 of the probe modules 34 and the exposed portions of the end surfaces of the cell pouch 52 are not in a normal contact state.

Referring to FIG. 10, in order to inspect an insulation resistance of the cell pouch 52, the probe module 34 is connected to the exposed portion on one side of the cell pouch 52, and the probe module 34 is connected to a voltage measurement terminal (Sense) of the interface unit 200 through the signal line 39. In addition, the probe module 34 on one side is connected to a sense terminal (Relay1), and the negative electrode lead 54 is connected to another sense terminal (Relay3). In this case, an insulation resistance of the cell pouch 52 may be measured by the electrical signal received by the sense terminal through the probe module 34 and the electrical signal received by the sense terminal through the negative electrode lead 54.

At this time, as a method of measuring an insulation resistance of the cell pouch 2, an alternating current of about 50 V is applied and a maximum resistance during a period of about 1 second is measured. When the resistance is measured as about 100 MO or more, it is determined that the cell pouch 52 is of good quality, and when the resistance is measured as less than about 100 MO, it is determined that the resistance between the cell pouch 52 and the negative electrode lead 54 has decreased, and the cell pouch 52 is defective.

As described above, the control unit receives a signal for the insulation resistance of the cell pouch through the interface unit, and determines that the cell pouch is defective as insulation breakdown when the signal indicates that the insulation resistance is less than about 100 MO, which is a reference of good quality.

As described above, according to the present disclosure, it is possible to detect an insulation defect of a cell pouch inside the battery module to detect all insulation defects that may occur in the entire battery module, resulting in high inspection reliability.

In addition, according to the present disclosure, by applying the probe guides in the wedge shape, it is easy for the inspection probe to enter a narrow space between the cell pouches.

Further, according to the present disclosure, it is possible to improve a contact force between the exposed portion of the flexible cell pouch and the electrical conduction portion of the inspection probe, thereby easily inspecting an insulation resistance of the cell pouch in the module as a finished product unit or before assembling a housing cover.

Still further, by providing the simple inspection equipment, it is possible to secure highly reliable inspection accuracy at a low investment cost, thereby reducing the cost in producing a battery pack for an coo-friendly vehicle.

What is claimed is:

1. An insulation resistance inspection system for a battery module cell pouch for inspecting an insulation resistance state of the cell pouch in a battery module configured by assembling a plurality of battery cells, the insulation resistance inspection system comprising:
    an inspection unit bringing each of a plurality of probe modules into contact with an end surface of the cell pouch to measure an insulation resistance of the cell pouch, wherein the inspection unit includes:
    an inspection table below which the battery module is disposed such that the insulation resistance is measured;
    a tray movably installed on the inspection table; and
    an inspection probe assembly installed on the tray to contact the end surface of the cell pouch such that the insulation resistance is measured, wherein the inspection probe assembly comprises:
    a slot die installed on the tray; and
    the plurality of probe modules fixedly installed side by side in the slot die and disposed to individually contact a plurality of cell pouches at respective positions corresponding to the plurality of cell pouches, wherein each of the probe modules includes:
    a cell pouch entry portion entering the cell pouch in contact with an exposed portion of the end surface of the cell pouch;

an electrical conduction portion provided inside the cell pouch entry portion and brought into contact with the cell pouch for electrical conduction;

a support fixed to a rear end of the cell pouch entry portion in a length direction of the cell pouch entry portion;

a pressure spring provided on an outer circumferential surface of the support and supported by the end of the cell pouch entry portion to provide a pressing force to the cell pouch entry portion; and a signal line electrically connected to the electrical conduction portion to transmit an electrical signal from the electrical conduction portion to the interface unit;

an interface unit connected to the inspection unit to receive a signal for the measured insulation resistance of the cell pouch; and a control unit receiving the signal for the insulation resistance of the cell pouch through the interface unit to determine whether the cell pouch is in good condition or in poor condition depending on whether the signal for the measured insulation resistance of the cell pouch is within a normal range that is a reference of good quality.

2. The insulation resistance inspection system of claim 1, further comprising: a driving cylinder disposed on the inspection table and connected to the tray to drive the tray forward or backward in a length direction of the inspection table.

3. The insulation resistance inspection system of claim 1, wherein the inspection table is attached to a vertical driving unit to be movable in a vertical direction.

4. The insulation resistance inspection system of claim 1, wherein the tray is provided to move along a rail attached to a lower side of the inspection table.

5. The insulation resistance inspection system of claim 1, wherein the insulation resistance is measured using the electrical signal measured by the probe module and an electrical signal measured through a leeno pin contacting a negative electrode lead of the battery cell.

6. The insulation resistance inspection system of claim 1, wherein the cell pouch entry portion includes entry guides facing each other in a wedge shape, and the cell pouch is inserted through the entry guides to contact the electrical conduction portion.

7. The insulation resistance inspection system of claim 1, wherein the electrical conduction portion is formed of electrically conductive rubber or copper (Cu).

* * * * *